US009153696B2

(12) United States Patent
An et al.

(10) Patent No.: US 9,153,696 B2
(45) Date of Patent: Oct. 6, 2015

(54) SEMICONDUCTOR DEVICE HAVING TRI-GATE TRANSISTOR AND METHOD OF MANUFACTURING THE SAME

(71) Applicants: Tae-Hyun An, Seoul (KR); Toshiro Nakanishi, Seongnam-si (KR); Gab-Jin Nam, Seoul (KR); Jong-Ho Lee, Hwaseong-si (KR)

(72) Inventors: Tae-Hyun An, Seoul (KR); Toshiro Nakanishi, Seongnam-si (KR); Gab-Jin Nam, Seoul (KR); Jong-Ho Lee, Hwaseong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 14/192,074

(22) Filed: Feb. 27, 2014

(65) Prior Publication Data

US 2015/0041913 A1    Feb. 12, 2015

(30) Foreign Application Priority Data

Aug. 8, 2013    (KR) .................... 10-2013-0094225

(51) Int. Cl.
*H01L 29/78* (2006.01)
*H01L 27/092* (2006.01)
*H01L 21/8238* (2006.01)

(52) U.S. Cl.
CPC .... *H01L 29/7856* (2013.01); *H01L 21/823821* (2013.01); *H01L 27/0924* (2013.01)

(58) Field of Classification Search
CPC ............ H01L 29/7856; H01L 27/0924; H01L 21/02502; H01L 21/823437
See application file for complete search history.

(56) References Cited

U.S. PATENT DOCUMENTS

| 7,425,497 B2 | 9/2008 | Chudzik et al. |
| 7,745,270 B2 | 6/2010 | Shah et al. |
| 7,791,140 B2 | 9/2010 | Van Dal et al. |
| 7,858,471 B2 | 12/2010 | Haller et al. |
| 7,868,395 B2 | 1/2011 | Watanabe et al. |
| 2013/0154002 A1 | 6/2013 | Kuo et al. |
| 2014/0217479 A1* | 8/2014 | Colinge et al. ................ 257/288 |

FOREIGN PATENT DOCUMENTS

| JP | 3111059 | 11/1999 |
| JP | 2013-021277 A | 1/2013 |
| KR | 10-0748261 B1 | 8/2007 |
| KR | 10-1173799 | 8/2012 |

* cited by examiner

*Primary Examiner* — William Coleman
(74) *Attorney, Agent, or Firm* — Harness, Dickey & Pierce

(57) ABSTRACT

A semiconductor device includes a substrate including an NMOS region, a fin active region protruding from the substrate in the NMOS region, the fin active region including an upper surface and a sidewall, a gate dielectric layer on the upper surface and the sidewall of the fin active region, a first metal gate electrode on the gate dielectric layer, the first metal gate electrode having a first thickness at the upper surface of the fin active region and a second thickness at the sidewall of the fin active region, and a second metal gate electrode on the first metal gate electrode, the second metal gate electrode having a third thickness at the upper surface of the fin active region and a fourth thickness at the sidewall of the fin active region, wherein the third thickness is less than the fourth thickness.

13 Claims, 8 Drawing Sheets

SEMICONDUCTOR DEVICE HAVING TRI-GATE TRANSISTOR AND METHOD OF MANUFACTURING THE SAME

CROSS-REFERENCE TO RELATED APPLICATIONS

This U.S. non-provisional patent application claims priority under 35 U.S.C. §119 to Korean Patent Application No. 10-2013-0094225, filed on Aug. 8, 2013, in the Korean Intellectual Property Office (KIPO), the contents of which are herein incorporated by reference in their entirety.

BACKGROUND

1. Field of the Invention

At least one example embodiment of the present inventive concepts relates to a semiconductor device having a tri-gate transistor and a method of manufacturing the same. According to at least one example embodiment of the present inventive concepts, the semiconductor device may comprise a substrate, a NMOS transistor including a first fin active region protruding from the substrate, and a PMOS transistor including a second fin active region protruding from the substrate. The NMOS transistor and the PMOS transistor may comprise a first metal gate electrode and a second metal gate electrode formed on the first metal gate electrode, respectively.

2. Description of the Related Art

According to high integration of semiconductor devices, a typical transistor has been steadily reduced in size and the transistor's performance, e.g., current-drive performance, also has been degraded. In order to increase the transistor's current-drive performance, there is increasing demand for using a dual-gate transistor having a two-dimensional channel surface or a tri-gate transistor having a three-dimensional channel surface.

As compared with the dual-gate transistor, the tri-gate transistor having a fin-type active region which has an upper surface and a sidewall is structurally more beneficial to improve current-drive performance. However, the tri-gate transistor typically presents some problems. One of the problems is that electric field formed by a gate electrode may be highly concentrated at the intersection of the sidewall and the upper surface of the fin-type active region, therefore the threshold voltage of the tri-gate transistor may be higher due to self-heating phenomenon at the intersection, and the reliability of a gate dielectric layer, e.g., time dependent dielectric breakdown (TDDB), may also be degraded. Therefore, research activities have been focused on reducing the electric field concentration phenomenon at the intersection of the fin-type active region in the tri-gate transistor.

SUMMARY

At least one example embodiment of the present inventive concepts provides a semiconductor device having a tri-gate transistor and a method of manufacturing the same.

In one example embodiment, a semiconductor device includes a substrate including an NMOS region and a PMOS region, a first fin active region protruding from the substrate in the NMOS region, the first fin active region including an upper surface and a sidewall, a second fin active region protruding from the substrate in the PMOS region, the second fin active region including an upper surface and a sidewall, a gate dielectric layer on the upper surfaces and the sidewalls of the first and second fin active regions, a first metal gate electrode on the gate dielectric layer, the first metal gate electrode having a first thickness at the upper surface of the first fin active region, a second thickness at the sidewall of the first fin active region, a third thickness at the upper surface of the second fin active region, and a fourth thickness at the sidewall of the second fin active region, and a second metal gate electrode on the first metal gate electrode, the second metal gate electrode having a fifth thickness at the upper surface of the first fin active region, a sixth thickness at the sidewall of the first fin active region, a seventh thickness at the upper surface of the second fin active region, and an eighth thickness at the sidewall of the second fin active region, wherein the third thickness is less than the fourth thickness, and/or wherein the fifth thickness is less than the sixth thickness.

In at least one example embodiment, the first thickness may be greater than the second thickness, and/or the seventh thickness may be greater than the eighth thickness.

In at least one example embodiment, the first metal gate electrode may include a first material having a first work function, and the second metal gate electrode may include a second material having a second work function. The second work function may be less than the first work function.

In at least one example embodiment, the first metal gate electrode may include titanium nitride (TiN), and the second metal gate electrode comprises titanium aluminum carbon compound (TiAlC) or titanium aluminum carbon oxide compound (TiAlCO).

In at least one example embodiment, the gate dielectric layer may include a high-k (high dielectric constant k as compared to a standard such as, for example, silicon dioxide) dielectric layer.

In at least one example embodiment, the semiconductor may further include a third metal gate electrode on the second metal gate electrode.

In another example embodiment of the inventive concepts, a semiconductor device includes a substrate including an NMOS region, a fin active region protruding from the substrate in the NMOS region, the fin active region including an upper surface and a sidewall, a gate dielectric layer on the upper surface and the sidewall of the fin active region, a first metal gate electrode on the gate dielectric layer, the first metal gate electrode having a first thickness at the upper surface of the fin active region and a second thickness at the sidewall of the fin active region, and a second metal gate electrode on the first metal gate electrode, the second metal gate electrode having a third thickness at the upper surface of the fin active region and a fourth thickness at the sidewall of the fin active region, wherein the third thickness is less than the fourth thickness.

In at least one example embodiment, the first thickness may be greater than the second thickness.

In at least one example embodiment, the semiconductor may further include an interlayer dielectric layer having a trench on the fin active region, wherein the first and second metal gate electrodes may be formed in the trench, and a third metal gate electrode directly on the second metal gate electrode, wherein the third metal gate electrode may fill the trench and include a planarized upper surface.

In still another example embodiment of the inventive concepts, the semiconductor device may include a substrate having a PMOS region, a fin active region protruding from the substrate in the PMOS region, the fin active region including an upper surface and a sidewall, a gate dielectric layer on the upper surface and the sidewall of the fin active region, a first metal gate electrode directly on the gate dielectric layer, the first metal gate electrode having a first thickness at the upper surface of the fin active region and a second thickness at the sidewall of the fin active region, and a second metal gate electrode on the first metal gate electrode, the second metal gate electrode having a third thickness at the upper surface of the fin active region and a fourth thickness at the sidewall of the fin active region, wherein the first thickness is less than the second thickness.

In at least one example embodiment, the third thickness may be greater than the fourth thickness.

In still another example embodiment of the inventive concepts, a method of manufacturing a semiconductor device includes providing a substrate having an NMOS region and a PMOS region, forming a first fin active region in the NMOS region, the first fin active region protruding from the substrate and including an upper surface and a sidewall, forming a second fin active region protruding from the substrate in the PMOS region, the second fin active region including an upper surface and a sidewall, forming a gate dielectric layer on the upper surfaces and sidewalls of the first and second fin active regions, forming a first metal gate electrode on the gate dielectric layer, the first metal gate electrode having a first thickness at the upper surface of the first fin active region, a second thickness at the sidewall of the first fin active region, a third thickness at the upper surface of the second fin active region, and a fourth thickness at the sidewall of the second fin active region, and forming a second metal gate electrode on the first metal gate electrode, the second metal gate electrode having a fifth thickness at the upper surface of the first fin active region, a sixth thickness at the sidewall of the first fin active region, a seventh thickness at the upper surface of the second fin active region, and an eighth thickness at the sidewall of the second fin active region, wherein the third thickness is less than the fourth thickness, and/or wherein the fifth thickness is less than the sixth thickness.

In at least one example embodiment, the method of forming the first metal gate electrode having the third thickness less than the fourth thickness may include forming a metal layer, having a thickness of about 30 Å to about 60 Å, on the upper surface and the sidewall of the second fin active region, and performing an etch back process to partially remove more than 10 Å from the metal layer formed on the upper surface of the second fin active region.

In at least one example embodiment, the method of forming the second metal gate electrode having the fifth thickness less than the sixth thickness may include forming a metal layer, having a thickness of about 30 Å to about 60 Å, on the upper surface and the sidewall of the first fin active region, and performing an etch back process to partially remove more than 10 Å from the metal layer formed on the upper surface of the first fin active region.

In at least one example embodiment, the first thickness may be greater than the second thickness, and/or the seventh thickness is greater than the eighth thickness.

In at least one example embodiment, the method of forming the first metal gate electrode may be performed by a physical vapor deposition process.

In at least one example embodiment, the method of forming the first metal gate electrode may include forming a first metal layer, having a thickness of about 3 Å to about 20 Å, on the upper surface and the sidewall of the first fin active region using an atomic layer deposition process, and forming a second metal layer, having a thickness of about 5 Å to about 30 Å, on the first metal layer formed on the upper surface of the first fin active region using a physical vapor deposition process.

In at least one example embodiment, the method of forming the second metal gate electrode may be performed by a physical vapor deposition process.

In at least one example embodiment, the method of forming the second metal gate electrode may include forming a first metal layer, having a thickness of about 30 Å to about 60 Å, on the upper surface and the sidewall of the second fin active region using an atomic layer deposition process, and forming a second metal layer, having a thickness of about 20 Å to about 40 Å, on the first metal layer formed on the upper surface of the second fin active region using a physical vapor deposition process.

In at least one example embodiment, the method may further include forming a third metal gate electrode on the second metal gate electrode.

In still another example embodiment of the inventive concepts, a method of manufacturing a semiconductor device includes providing a substrate including an NMOS region, forming a fin active region in the NMOS region, the fin active region protruding from the substrate and including an upper surface and a sidewall, forming a gate dielectric layer on the upper surface and the sidewall of the fin active region, forming a first metal gate electrode on the gate dielectric layer, the first metal gate electrode having a first thickness at the upper surface of the fin active region and a second thickness at the sidewall of the fin active region, and forming a second metal gate electrode on the first metal gate electrode, the second metal gate electrode having a third thickness at the upper surface of the fin active region and a fourth thickness at the sidewall of the fin active region, wherein the third thickness is less than the fourth thickness.

In at least one example embodiment, the first thickness may be greater than the second thickness.

In still another example embodiment of the inventive concepts, a method of manufacturing a semiconductor device includes providing a substrate including a PMOS region, forming a fin active region in the PMOS region, the fin active region protruding from the substrate and including an upper surface and a sidewall, forming a gate dielectric layer on the upper surface and the sidewall of the fin active region, forming a first metal gate electrode on the gate dielectric layer, the first metal gate electrode having a first thickness at the upper surface of the fin active region and a second thickness at the sidewall of the fin active region, and forming a second metal gate electrode on the first metal gate electrode, the second metal gate electrode having a third thickness at the upper surface of the fin active region and a fourth thickness at the sidewall of the fin active region, wherein the first thickness is less than the second thickness.

In at least one example embodiment, the third thickness may be greater than the fourth thickness.

In still another example embodiment of the inventive concepts, a method of manufacturing a semiconductor device includes providing a substrate including an NMOS region and a PMOS region, forming a fin active region protruding from the substrate, the fin active region including an upper surface and a sidewall, forming a gate dielectric layer on the upper surface and the sidewall of the fin active region, forming a first metal gate electrode on the gate dielectric layer, and forming a second metal gate electrode including aluminum (Al) on the first metal gate electrode, wherein the second metal gate electrode has a first aluminum concentration at the upper surface of the fin active region and a second aluminum concentration at the sidewall of the fin active region, the first aluminum concentration being different from the second aluminum concentration.

In at least one example embodiment, the fin active region may be formed in the NMOS region.

In at least one example embodiment, the method may further include at least one of an ion implantation process and a plasma-doping process in order to inject titanium (Ti) or carbon (C) into the second metal gate electrode formed on the upper surface of the fin active region, wherein the first aluminum concentration may be less than the second aluminum concentration.

In at least one example embodiment, the fin active region may be formed in the PMOS region.

In at least one example embodiment, the method may further include at least one of an ion implantation process and a plasma doping process in order to inject aluminum (Al) into the second metal gate electrode formed on the upper surface of the fin active region, wherein the first aluminum concentration may be greater than the second aluminum concentration.

BRIEF DESCRIPTION OF THE DRAWINGS

The foregoing and other features and advantages of the inventive concepts will be apparent from the more particular description of the example embodiments, as illustrated in the accompanying drawings in which like reference characters refer to the same parts throughout the different views. The drawings are not necessarily to scale, emphasis instead being placed upon illustrating the principles of the inventive concepts.

DETAILED DESCRIPTION OF EXAMPLE EMBODIMENTS

Figure 1:
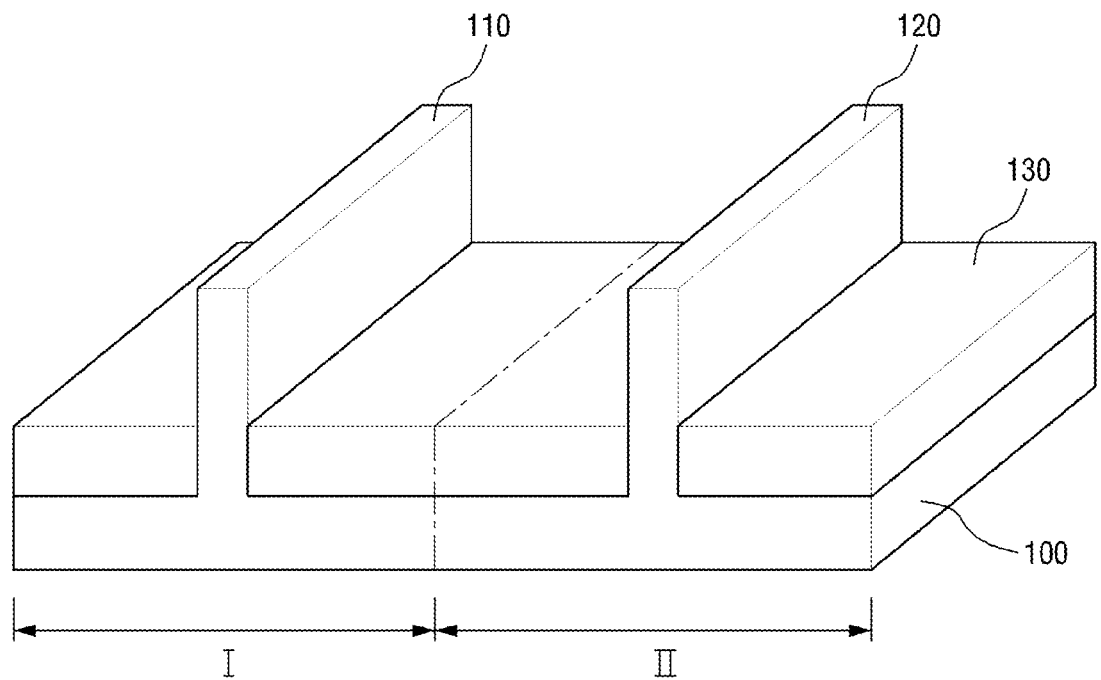
FIGS. 1 through 9 are cross-sectional views illustrating a method of manufacturing a semiconductor device according to an example embodiment of the inventive concepts.

Example embodiments of the inventive concepts will now be described more fully hereinafter with reference to the accompanying drawings; however, they may be embodied in different forms and should not be construed as limited to the example embodiments set forth herein. Rather, these example embodiments are provided so that this disclosure will be thorough and complete, and will fully convey the scope of the inventive concepts to those skilled in the art.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent").

It will be understood that, although the terms "first", "second", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

In the drawing figures, the dimensions of layers and regions may be exaggerated for clarity of illustration. Like reference numerals refer to like elements throughout. The same reference numbers indicate the same components throughout the specification.

Spatially relative terms, e.g., "beneath," "below," "lower," "above," "upper" and the like, may be used herein for ease of description to describe the relationship of one element or feature to another element(s) or feature(s), as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. The use of the terms "a" and "an" and "the" and similar referents in the context of describing embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to") unless otherwise noted.

Unless defined otherwise, all technical and scientific terms used herein have the same meaning as commonly understood by one of ordinary skill in the art. It is noted that the use of any and all examples, or exemplary terms provided herein is intended merely to better illuminate the example embodiments and is not a limitation on the scope of the inventive concepts unless otherwise specified.

Example embodiments will be described with reference to perspective views, cross-sectional views, and/or plan views. The profile of an example view may be modified according to, e.g., manufacturing techniques and/or allowances. Accordingly, the example embodiments are not intended to limit the scope, but cover all changes and modifications that can be caused due to, e.g., a change in manufacturing process. Thus, regions shown in the drawings are illustrated in schematic form and the shapes of the region are presented simply by way of illustration and not as a limitation.

Hereinafter, example embodiments of the inventive concepts will be described in detail with reference to the accompanying drawings.

FIGS. 1 through 9 are cross-sectional views illustrating a method of manufacturing a semiconductor device according to an example embodiment of the inventive concepts.

Referring to FIG. 1, a substrate 100 having a first region I and a second region II may be provided. The substrate 100 may comprise, among others, a rigid substrate, e.g., a bulk silicon substrate, a silicon-on-insulator (SOI) substrate, a germanium substrate, a silicon germanium substrate, an indium antimonide substrate, a lead telluride substrate, an indium arsenide substrate, an indium phosphorus substrate, a gallium arsenide substrate, or an antimony gallium substrate. The first region I may be, for example, an NMOS region and the second region II may be, for example, a PMOS region.

In at least one example embodiment, a first fin active region 110 protruding from the substrate 100 may be formed in the first region I and a second fin active region 120 protruding from the substrate 100 may be formed in the second region II. The first and second fin active regions 110 and 120 may have upper surfaces and sidewalls, respectively. The first and second fin active regions 110 and 120 may be formed by etching the substrate 100 after forming a mask pattern on the substrate 100. For example, the substrate 100 may be etched at a depth of about 100 nm to about 300 nm.

In at least one example embodiment, a device isolation region 130 may be formed on the substrate 100. The device isolation layer 130 may comprise a silicon oxide layer formed by a high-density plasma (HDP) process or a flowable chemical vapor deposition (FCVD) process. The device isolation region 130 may be formed not only at the boundary of the first region I and the second region II but also in the first and second regions I and II, respectively. In at least one example embodiment, a method of forming the device isolation region 130 may include forming a silicon oxide layer on the substrate 100 to cover the first and second fin active regions 110 and 120, and performing an etch-back process to expose the upper surfaces and upper portions of the sidewalls of the first and second fin active regions 110 and 120. After the etch-back process, the height of the exposed sidewalls of the first and second fin active regions 110 and 120 may have a range of 20 nm to 50 nm.

Figure 2:
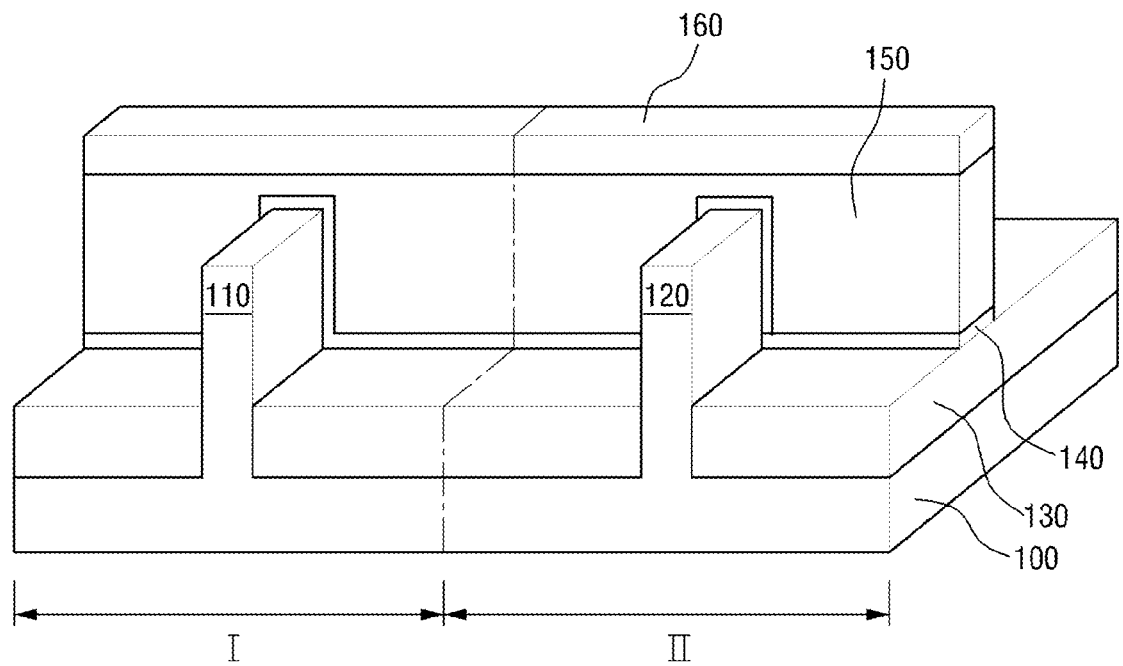

Referring to FIG. 2, in at least one example embodiment, a dummy gate pattern 150 may be formed on the isolation region 130 and pass across from the first fin active region 110 to the second fin active region 120. The dummy gate pattern 150 may include, for example, polycrystalline silicon. A sacrificial layer 140 may be formed beneath the dummy gate pattern 150, and a hard mask pattern 160 may be formed on the dummy gate pattern 150.

In at least one example embodiment, a method of forming the dummy gate pattern 150 may include forming a sacrificial layer 140 and a polycrystalline silicon layer on the first and second fin active regions 110 and 120, performing an etch-back process or a chemical mechanical polishing (CMP) process to planarize the upper surface of the polycrystalline silicon layer, forming a hard mask pattern 160 on the upper surface of the polycrystalline silicon layer, and patterning the polycrystalline silicon layer using the hard mask pattern 160 as an etch mask.

Figure 3:
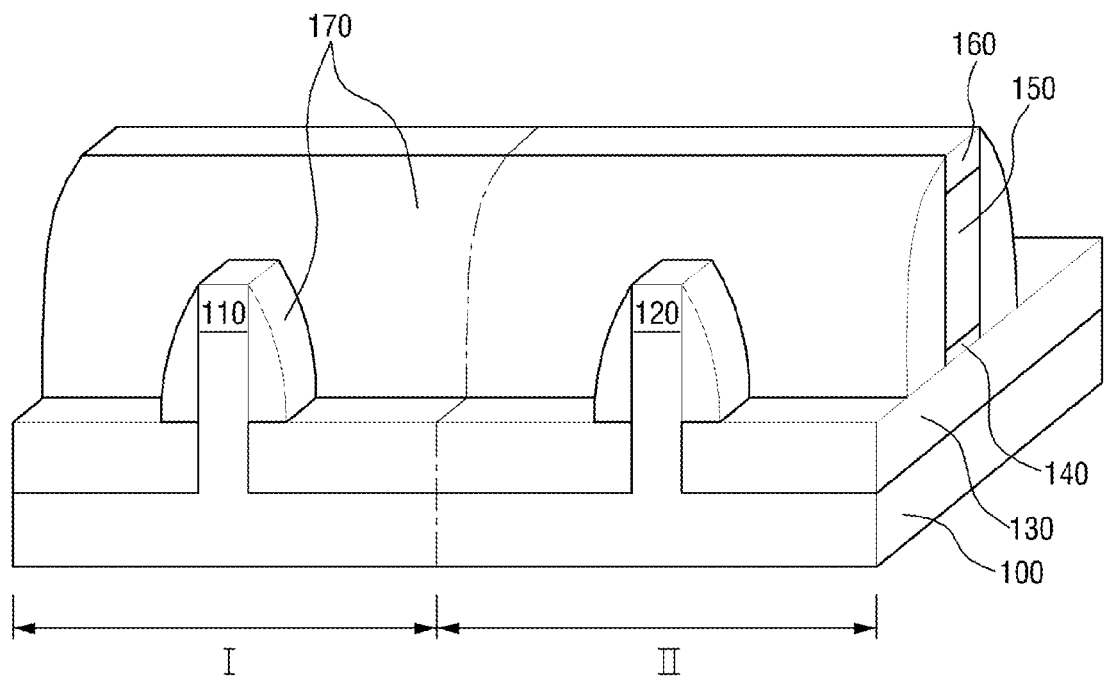

Referring to FIG. 3, in at least one example embodiment, at least one spacer 170 may be formed on one or more sidewalls of the dummy gate pattern 150, the first fin active region 110, and the second fin active region 120. The spacer 170 may comprise, for example, at least one of silicon nitride (SiN) and silicon oxynitride (SiON). A method of forming the spacer 170 may include forming a silicon nitride layer or a silicon oxynitride layer on the hard mask pattern 160 and the first and second fin active regions 110 and 120, and performing an etch-back process to expose the upper surfaces of the isolation region 130, the hard mask pattern 160, and the first and second fin active regions 110 and 120.

Figure 4:
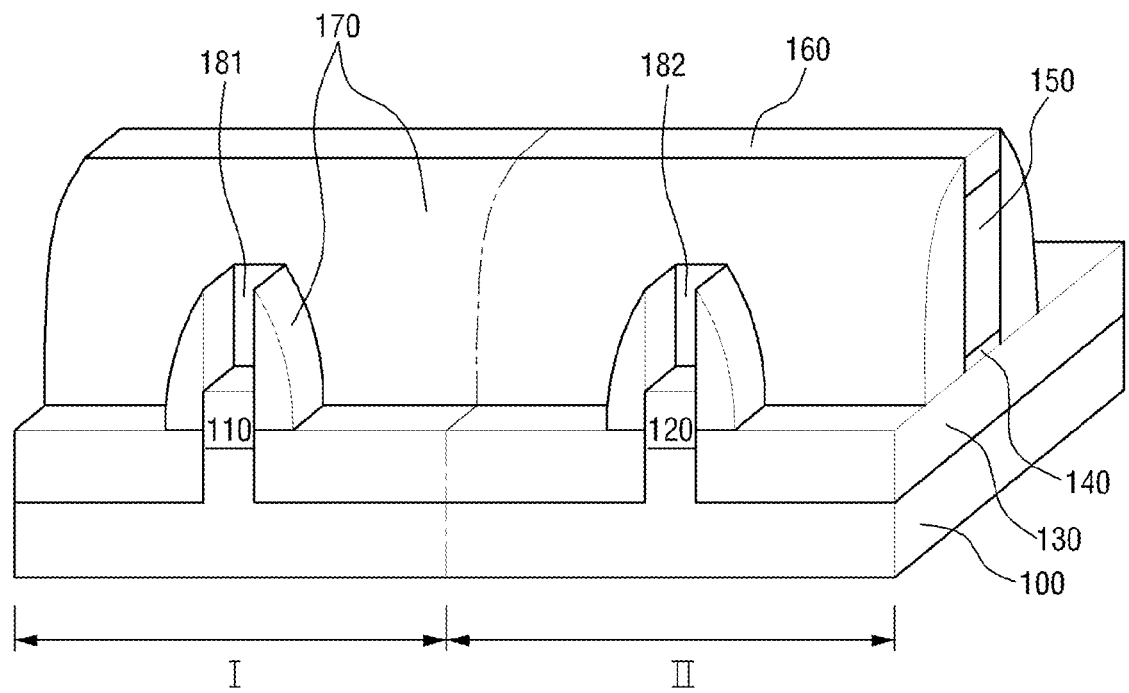

Referring to FIG. 4, in at least one example embodiment, a first recess region 181 and a second recess region 182 may be formed by etching the upper surfaces of the first and second fin active regions 110 and 120. The bottom sides of the first and second recess regions 181 and 182 may be higher than the upper surface of the device isolation region 130. However, the bottom sides of the first and second recess regions 181 and 182 may be at the same level as, or lower than, the upper surface of the device isolation region 130.

Figure 5:
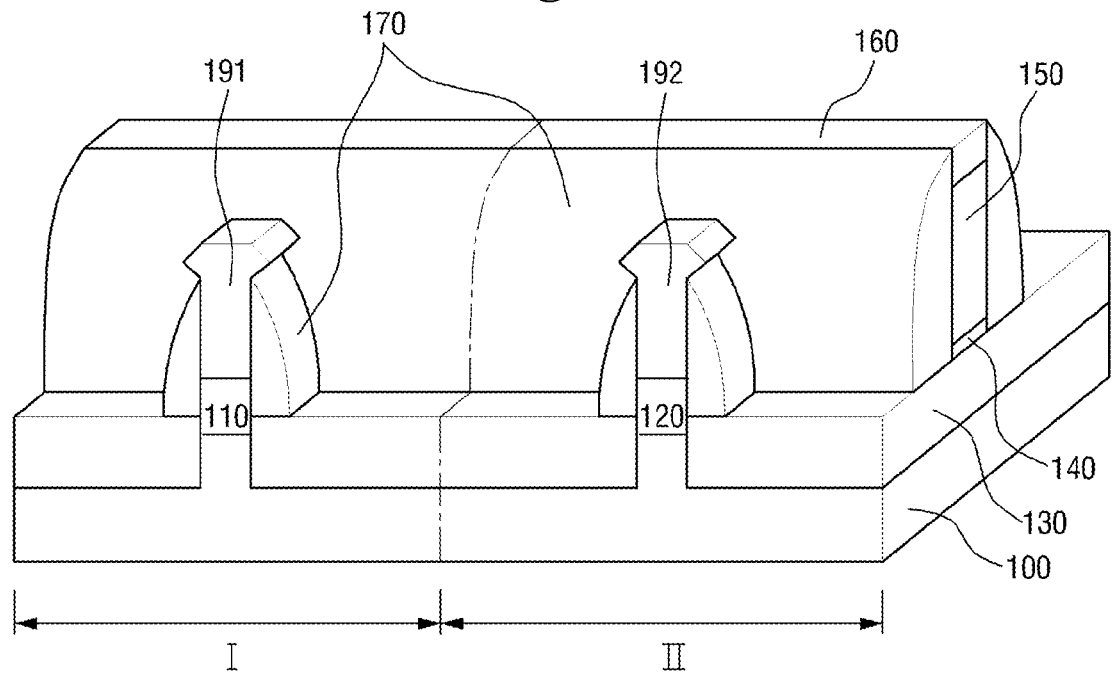

Referring to FIG. 5, in at least one example embodiment, a first and a second epitaxial layer 191 and 192 may be simultaneously formed in the first and second recess regions 181 and 182, respectively. The first and second epitaxial layers 191 and 192 may have upper surfaces protruding from the first and second recess regions 181 and 182. The upper surfaces of the first and second epitaxial layers 191 and 192 may be, for example, lower than the upper surface of the hard mask pattern 160, or the first and second epitaxial layers 191 and 192 may be at the same level or higher than the upper surface of the hard mask pattern 160.

In at least one example embodiment, the first epitaxial layer 191 may be a source/drain region of an NMOS transistor and the second epitaxial layer 192 may be a source/drain region of a PMOS transistor. After forming the first and second epitaxial layers 191 and 192, n-type dopants may be injected into the first epitaxial layer 191 using a first ion implantation process, and p-type dopants may be injected into the second epitaxial layer using a second ion implantation process.

In at least one example embodiment, the first and second epitaxial layers 191 and 192 may be formed successively. Therefore, n-type dopants may be injected into the first epitaxial layer 191 using a first in-situ epitaxial process to form a source/drain of a NMOS transistor, and the p-type dopants may be injected into the second epitaxial layer 192 using a second in-situ epitaxial process to formed a source/drain of a PMOS transistor.

Figure 6:
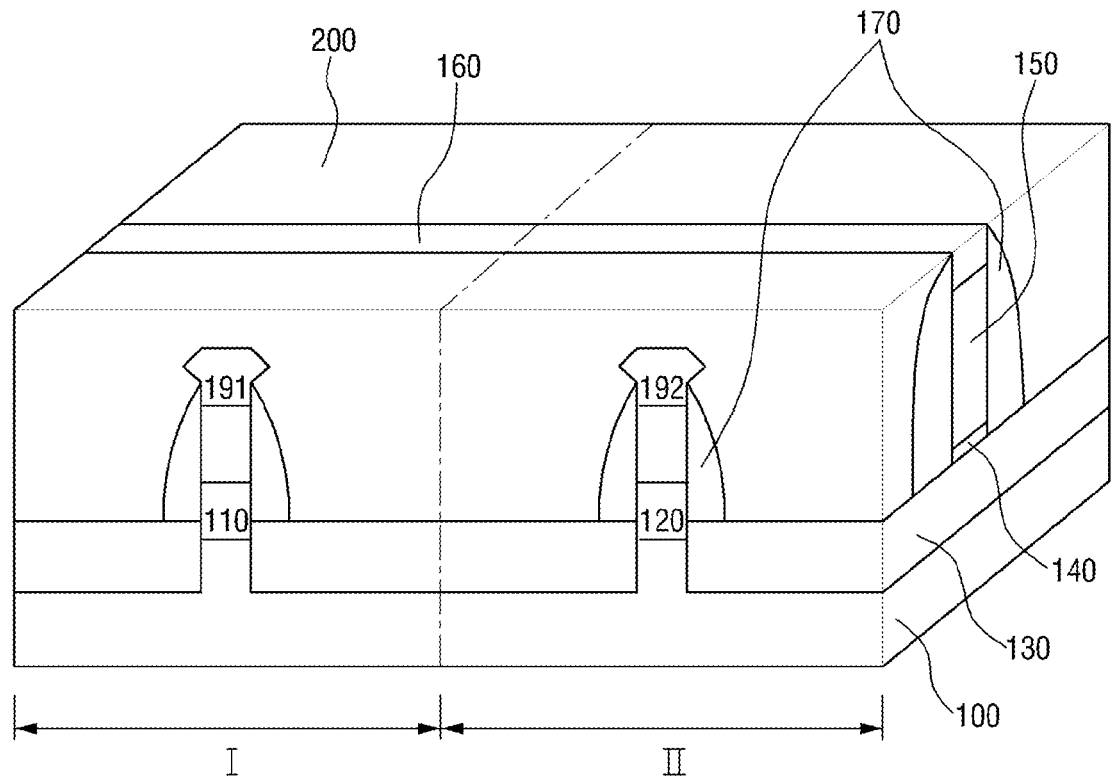

Referring to FIG. 6, in at least one example embodiment, an interlayer dielectric layer 200 may be formed on the first and second epitaxial layers 191 and 192, the device isolation region 130, and the spacer 170. The interlayer dielectric layer 200 may be formed, for example, by using a high-density plasma (HDP) process, a spin-on-glass (SOG) process, a chemical vapor deposition (CVD) process, or a flowable chemical vapor deposition (FCVD) process. It should be noted that other processes may be utilized to form the interlayer dielectric layer 200.

In at least one example embodiment, a method of forming the interlayer dielectric layer 200 may include forming a silicon oxide layer on the hard mask pattern 160 and the spacer 170, and performing an etch-back process or a chemical mechanical polishing (CMP) process to expose the upper surface of the hard mask pattern 160.

Figure 7:
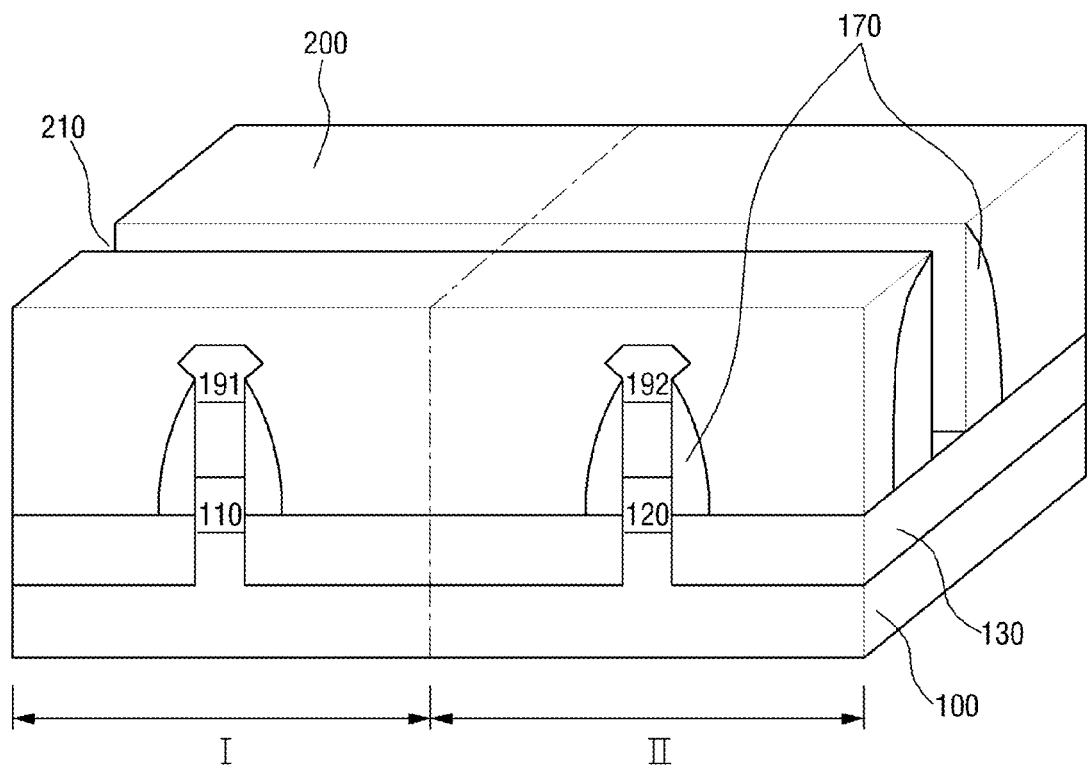

Referring to FIG. 7, in at least one example embodiment, a third recess region 210 may be formed by removing the hard mask pattern 160, the dummy gate pattern 150, and the sacrificial layer 140. The first and second fin active regions 110 and 120 and the device isolation region 130 may be exposed at the bottom of the third recess region 210. The third recess region 210 may be called as a trench.

Figure 8:
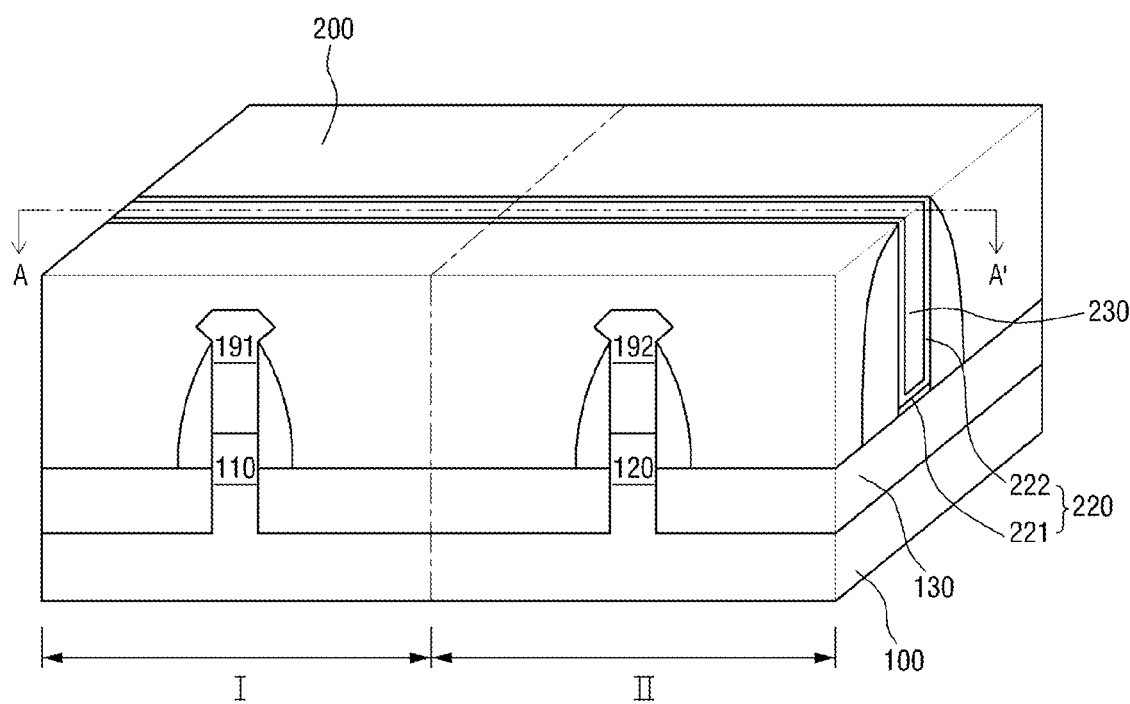

Referring to FIG. 8, in at least one example embodiment, a gate dielectric layer 220 and a gate electrode 230 may be formed on the first and second fin active regions 110 and 120 in the third recess region 210. The gate dielectric layer 220 may be formed of a first gate dielectric layer 221 including a silicon oxide layer and a second gate dielectric layer 222 including a high-k dielectric layer. The gate dielectric layer 220 may be formed by at least one process of, for example, a thermal oxidation process, an atomic layer deposition (ALD) process, and a chemical vapor deposition (CVD) process. It should be noted that other deposition processes may also be utilized to form the gate dielectric later 220 and/or the gate electrode 230. The gate electrode 230 may include metal and be formed by an atomic layer deposition (ALD) process or a physical vapor deposition (PVD) process. It should be noted that other deposition processes may also be utilized to form the gate dielectric layer 220 and/or the gate electrode 230.

In at least one example embodiment, a method of forming the gate dielectric layer 220 and the gate electrode 230 may include performing an etch-back process, a chemical mechanical polishing (CMP) process, or yet another process to expose the upper surface of the interlayer dielectric layer 220 after forming the gate dielectric layer 220 and the gate electrode 230 in the third recess region 210 and on the interlayer dielectric layer 200.

Figure 9:
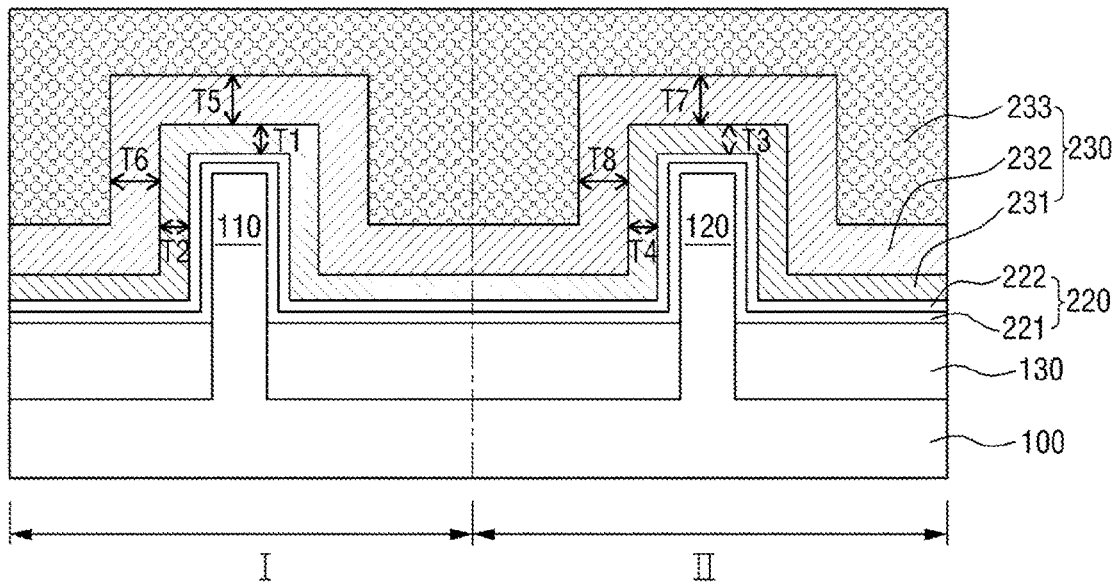

FIG. 9 is a cross-sectional view of line A-A' of FIG. 8. Referring to FIG. 9, in at least one example embodiment, the thicknesses of the first gate dielectric layer 221 and of the second gate dielectric layer 222 which are formed on the upper surfaces and the sidewalls of the first and second fin active regions 110 and 120 may be greater than the thicknesses of the first gate dielectric layer 221 and the second gate dielectric layer 222 which are formed on the upper surface of the device isolation layer 130. The gate electrode 230 may comprise a first metal gate electrode 231 including, for example, titanium (Ti), a second metal gate electrode 232 including, for example, aluminum (Al), and a third metal gate electrode 233 including, for example tungsten (W). It should be noted that other types of metals may be used for the first, second and third metal gate electrodes 231, 232 and 233. The third metal gate electrode 233 may have a thickness of, for example, about 30 nm to about 200 nm.

In at least one example embodiment, the first metal gate electrode 231 may, for example, determine a work function value of the PMOS transistor formed in the second region II and the second metal gate electrode 232 may, for example, determine a work function value of the NMOS transistor formed in the first region I. The first metal gate electrode 231 may have a first work function value of, for example, about 4.8 eV and the second metal gate electrode 232 may have a second work function value of, for example, about 4.3 eV.

In at least one example embodiment, the first metal gate electrode 231 may have a first thickness T1 at the upper surface of the first fin active region 110, a second thickness T2 at the sidewall of the first fin active region 110, a third thickness T3 at the upper surface of the second fin active region 120, and a fourth thickness T4 at the sidewall of the second fin active region 120.

The second metal gate electrode 232, which is formed on the first metal gate electrode 231, may have a fifth thickness T5 at the upper portion of the first fin active region 110, a sixth thickness T6 at the side portion of the first fin active region 110, a seventh thickness T7 at the upper portion of the second fin active region 120, and an eighth thickness T8 at the side portion of the second fin active region 120.

In at least one example embodiment, when comparing with a planar transistor, the tri-gate transistor having a three-dimensional channel structure, e.g., a fin-type active region, may present disadvantages. For example, an electric field induced by the metal gate electrodes 231 and 232 may be concentrated at the intersection between the sidewall and the upper surface of the fin-type active region. The threshold voltage of the tri-gate transistor may also increase due to a self-heating phenomenon. The reliability of the gate dielectric layer 220, e.g., time-dependent dielectric breakdown (TDDB), may also be degraded.

In example embodiments according to the inventive concepts, the electric field concentration phenomenon taking place at the intersection between the sidewall and the upper surface of the fin-type active region is reduced by about 22% and the TDDB characteristic of the gate dielectric layer 220 has been improved by about 10%.

In at least one example embodiment, if an NMOS transistor is formed in the first region I, there are several methods, according to the inventive concepts, for reducing the electric field concentration phenomenon which may be formed at the intersection between the sidewall and the upper surface of the first fin active region 110, as further explained below.

In at least one example embodiment, the second metal gate electrode 232, which may mainly decide the work function value of the NMOS transistor and having the thicknesses T5, T6, T7, and T8 as mentioned above, may be formed on the first metal gate electrode 231. For reducing the electric field concentration phenomenon, the thickness T5 may be less than the thickness T6. For example, if the thickness T6 is about 45 Å, the thickness T5 may be about 30 Å. Accordingly, in at least one example embodiment, when the thickness T5 is less than the thickness T6, the electric field concentration phenomenon is reduced because the threshold voltage of the NMOS transistor may be increased at the upper surface of the first fin active region 110 and the electric field may be reduced at the intersection of the sidewall and the upper surface of the first fin active region 110. Accordingly, the thicknesses T7 and T8 of the second gate electrode 232, which are formed on the second fin active region 120, may be substantially similar to the thickness T6, and the thicknesses T3 and T4 of the first metal gate electrode 231 formed on the second fin active region 120 may have substantially the same thickness. Also, the thicknesses T3 and T4 may be less than the thickness T1 or T2.

In at least one example embodiment, the first metal gate electrode 231 having the thickness T1 greater than the thickness T2 may be formed on the upper surface and on the sidewall of the first fin active region 110. When the thickness T1 is greater than the thickness T2, the distance between the second metal gate electrode 231 and the upper surface of the first fin active region 110 is greater than the distance between the second metal gate electrode 231 and the sidewall of the first fin active region 110. Accordingly, not only the electric field, which is formed at the intersection of the side wall and the upper surface of the first fin active region 110 and is induced by the second metal gate electrode 232, may be reduced, but the electric field concentration phenomenon may also be reduced at the intersection. Also, the thickness T3 and the thickness T4 of the first metal gate electrode 231, which is formed on the second fin active region 120, may have substantially the same thickness and may both be greater than the thickness T1 of the first metal gate electrode 231 which is formed on the first fin active region 110. In at least one example embodiment, the thicknesses T5, T6, T7, and T8 may have substantially the same thickness.

In at least one example embodiment, the first metal gate electrode 231 having the thickness T1 greater than the thickness T2 may be formed on the upper surface and sidewall of the first fin active region 110, and the second metal gate electrode 232 having the thickness T5 that is less than the thickness T6 may be formed on the first metal electrode 231. Also, the thicknesses T3 and T4 of the first metal gate electrode 231 may have substantially the same thickness and may both be greater than the thickness T1. In at least one example embodiment, the thicknesses T6, T7 and T8 of the second metal gate electrode 232 may have substantially the same thickness.

In at least one example embodiment, when the thickness T5 is significantly less than the thickness T6 (i.e., T5<<T6), the electric field concentration phenomenon may be reduced at the intersection of the sidewall and the upper surface of the first fin active region 110 even though the thickness T1 is slightly less than the thickness T2. Also, the thicknesses T3 and T4 of the first metal gate electrode 231 may have substantially the same thickness and may both be greater than the thickness T1 or than the thickness T2. In at least one example embodiment, the thicknesses T6, T7, and T8 may also have substantially the same thickness.

In at least one example embodiment, when the thickness T2 is significantly less than the thickness T1 (i.e., T1>>T2), the electric field concentration phenomenon may be reduced at the intersection of the sidewall and the upper surface of the first fin active region 110 even though the thickness T5 is slightly greater than the thickness T6. Also, the thicknesses T3 and T4 of the first metal gate electrode 231 may have substantially the same thickness and may both be greater than the thickness T1. In at least one example embodiment, the thicknesses T6, T7, and T8 may also have substantially the same thickness.

In at least one example embodiment, the first metal gate electrode 231 having the thickness T1 greater than the thickness T2 may be formed by, for example, using a physical vapor deposition (PVD) process because the PVD process may generally form a layer which has greater thickness at the upper surface than the sidewall of the fin-type active region. Optionally, a method of forming the first metal gate electrode 231 may include conformally depositing a first metal layer having a thickness of about 3 Å to about 20 Å on the upper surface and the sidewall of the first fin active region 110 by using an ALD process, and then depositing a second metal layer having a thickness of about 5 Å to about 30 Å on the upper surface of the first metal layer by using a non-conformal PVD process.

In at least one example embodiment, the method of forming the second metal gate electrode 232 having the thickness T5 less than the thickness T6 may include performing an etch-back to remove more than about 10 Å of the second metal gate electrode 232 formed on the upper portion of the first fin active region 110 after conformally forming the second metal gate electrode 232 having a thickness of about 30 Å to about 60 Å on the first metal gate electrode 231.

In at least one example embodiment, the following Table 1 summarizes five different methods, which are exemplary embodiments of the inventive concepts as mentioned above, for reducing the electric field concentration phenomenon at the intersection between the upper surface and the sidewall of the first fin active region 110.

TABLE 1

| Methods | Thickness [Essential Element(s)] | Others [Optional Elements] |
| --- | --- | --- |
| Method 1 | T5 < T6 | T1 ≈ T2, T1(or T2) < T3 ≈ T4, T6 ≈ T7 ≈ T8 |
| Method 2 | T1 > T2 | T1 < T3 ≈ T4, T5 ≈ T6 ≈ T7 ≈ T8 |
| Method 3 | T1 > T2 and T5 < T6 | T1 < T3 ≈ T4, T6 ≈ T7 ≈ T8 |
| Method 4 | T5 << T6 and T1 < T2 | T1(or T2) < T3 ≈ T4, T6 ≈ T7 ≈ T8 |
| Method 5 | T1 >> T2 and T5 > T6 | T1 < T3 ≈ T4, T6 ≈ T7 ≈ T8 |

In at least one example embodiment, when a PMOS transistor is formed in the second region II, there are several methods, according to the inventive concepts, for reducing the electric field concentration phenomenon which may be formed at the intersection between the sidewall and the upper surface of the second fin active region 120 as follows.

Firstly, in at least one example embodiment, the first metal gate electrode 231, which may determine the work function value of the PMOS transistor and has the thicknesses T1, T2, T3, and T4 as mentioned above, may be formed on the upper surface and sidewall of the second fin active region 120. For reducing the electric field concentration phenomenon, the thickness T3 may be less than the thickness T4. For example, if the thickness T3 may be about 30 Å, the thickness T4 may be about 50 Å. Also, if the thickness T3 is less than the thickness T4, the electric field concentration phenomenon may be reduced at the intersection between the sidewall and the upper surface of the second fin active region 120. The thicknesses T1 and T2 of the first metal gate electrode 231 formed on the first fin active region 110 may have substantially the same thickness. The thicknesses T1 and T2 may be less than the thickness T3. The thicknesses T5, T6, T7, and T8 of the second metal gate electrode 232 may have substantially the same thickness.

Secondly, in at least one example embodiment, the second metal gate electrode 232 having the thickness T7 greater than the thickness T8 may be formed on the first metal gate electrode 231. When the thickness T7 is greater than the thickness T8, the threshold voltage of the PMOS transistor may be increased at the upper surface of the second fin active region 120, and the second metal gate electrode 232, which may have a work function value of about 4.3 eV, may decrease the total work function value of PMOS transistor at the upper surface of the second fin active region 120. Therefore, the electric field concentration phenomenon may be reduced at the intersection between the sidewall and the upper surface of the second fin active region 120. Also, the thickness T1 and the thickness T2 of the first metal gate electrode 231 formed on the first fin active region 110 may have substantially the same thickness. The thicknesses T1 and T2 may be less than the thickness T3. The thicknesses T3 and T4 may have substantially the same thickness, and the thicknesses T5, T6, and T8 may have substantially the same thickness.

Thirdly, in at least one example embodiment, the first metal gate electrode 231 having the thickness T3 less than the thickness T4 may be formed on the upper surface and the sidewall of the second fin active region 120, and the second metal gate electrode 232 having the thickness T7 greater than the thickness T8 may be formed on the first metal gate electrode 231. Also, the thicknesses T1 and T2 of the first metal gate electrode 231 may have substantially the same thickness, and may both be less than the thickness T3. The thicknesses T5, T6 and T8 may have substantially the same thickness.

Fourthly, in at least one example embodiment, if the thickness T3 is much less than the thickness T4 (i.e., T3<<T4), the electric field concentration phenomenon may be reduced at the intersection between the sidewall and the upper surface of the second fin active region 120 even though the thickness T7 is a little less than the thickness T8. Also, the thicknesses T1 and T2 of the first metal gate electrode 231 may have substantially the same thickness, and may both be less than the thickness T3. The thicknesses T5, T6, and T8 may also have substantially the same thickness.

Fifthly, in at least one example embodiment, if the thickness T7 is much greater than the thickness T8 (i.e., T7>>T8), the electric field concentration phenomenon may be reduced at the intersection between the sidewall and the upper surface of the second fin active region 120 even though the thickness T3 is slightly greater than the thickness T4. Also, the thickness T1 and the thickness T2 of the first metal gate electrode 231 may have substantially the same thickness, and may both be less than the thickness T3. The thicknesses T5, T6, and T8 may also have substantially the same thickness.

In at least one example embodiment, the second metal gate electrode 232 having the thickness T7 greater than the thickness T8 may be formed by using a non-conformal physical vapor deposition (PVD) process because the non-conformal PVD process may generally form a layer which has a greater thickness at the upper surface than at the sidewall of the fin-type active region. Optionally, another method of forming the second metal gate electrode 232 may include conformally depositing a first metal layer having a thickness of about 30 Å to about 60 Å on the first metal gate electrode 231 by using an ALD process, and then depositing a second metal layer having a thickness of about 20 Å to about 40 Å on the upper surface of the first metal layer by using a non-conformal PVD process.

In at least one example embodiment, the method of forming the first metal gate electrode 231 having the thickness T3 less than the thickness T4 may include performing an etch-back to remove more than about 10 Å of the first metal gate electrode 231 formed on the upper surface of the second fin active region 120 after conformally forming the first metal gate electrode 231 having a thickness of about 30 Å to about 60 Å on the upper surface and the sidewall of the second fin active region 120.

The following Table 2 summarizes the five methods, which are exemplary embodiments of the inventive concepts as mentioned above, for reducing the electric field concentration phenomenon at the intersection between the upper surface and the sidewall of the second fin active region 120.

TABLE 2

| Methods | Thickness [Essential Element(s)] | Others [Optional Elements] |
| --- | --- | --- |
| Method 6 | T3 < T4 | T1 ≈ T2, T1(or T2) < T3, T5 ≈ T6 ≈ T7 ≈ T8 |
| Method 7 | T7 > T8 | T1 ≈ T2, T1(or T2) < T3 ≈ T4, T5 ≈ T6 ≈ T8 |
| Method 8 | T3 < T4 and T7 > T8 | T1 ≈ T2, T1(or T2) < T3, T5 ≈ T6 ≈ T8 |
| Method 9 | T3 << T4 and T7 < T8 | T1 ≈ T2, T1(or T2) < T3, T5 ≈ T6 ≈ T8 |
| Method 10 | T7 >> T8 and T3 > T4 | T1 ≈ T2, T1(or T2) < T4, T5 ≈ T6 ≈ T8 |

In at least one example embodiment, when an NMOS transistor having the first fin active region 110 is formed in the first region I and a PMOS transistor having the second fin active region 120 is formed in the second region II, various methods providing different thicknesses of the first and second metal gate electrodes 231 and 232 may be used by combining the Methods 1 through 10 described in TABLES 1 and 2 above in order to reduce the electric field concentration phenomenon.

Other methods according to other inventive concepts for reducing the electric field concentration phenomenon are described below. The methods may use different composition ratio of the second metal gate electrode 232 formed on the first metal gate electrode 231. Hereinafter, the methods are described in detail with reference to the accompanying drawings.

Figure 10A:
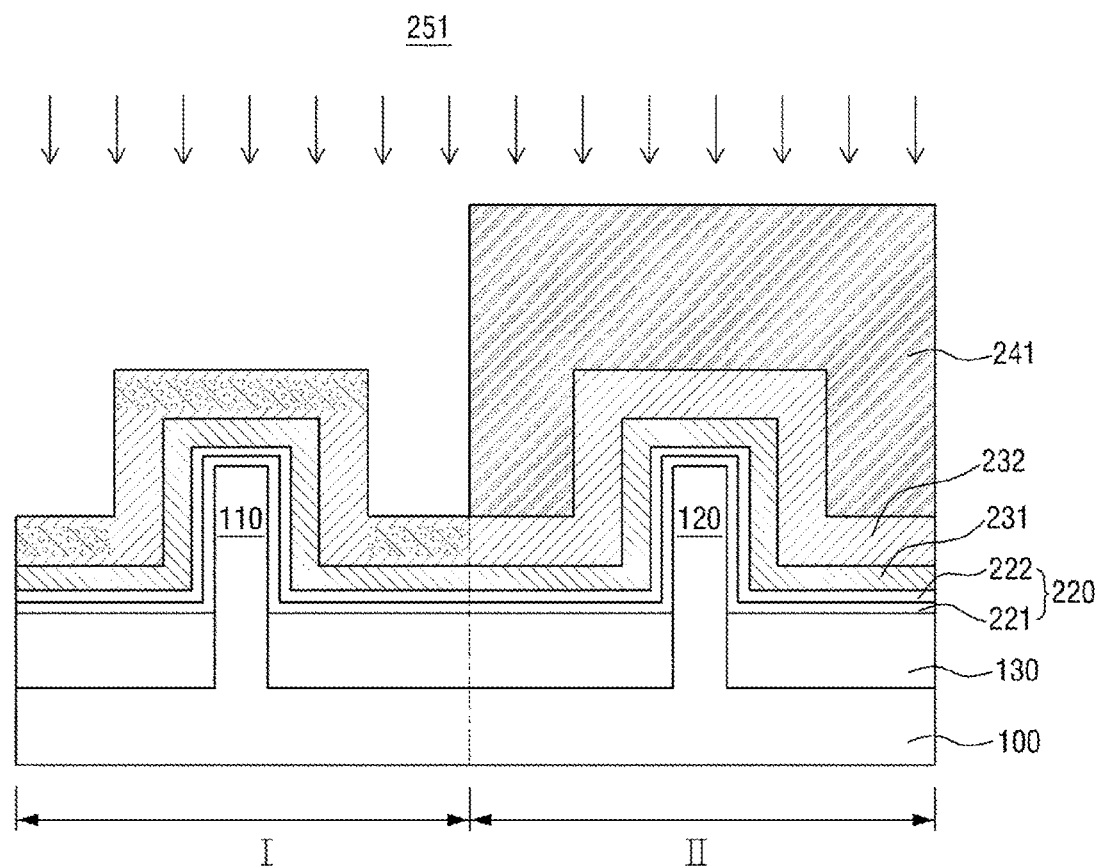
FIGS. 10A through 11C are cross-sectional views illustrating a method of manufacturing a semiconductor device according to another example embodiment of the inventive concepts.

Referring to FIG. 10A, in at least one example embodiment, a first photoresist pattern 241 may be formed on the second metal gate electrode 232 formed in the second region II, for example before forming the third metal gate electrode 233 shown in FIG. 9. The thicknesses T1, T2, T3 and T4 may have substantially the same thickness, and the thicknesses T5, T6, T7 and T8 may also have substantially the same thickness. The second metal gate electrode 232 may include aluminum (Al), e.g., titanium-aluminum-carbon compound (TiAlC) or titanium-aluminum-carbon-oxide compound (TiAlCO), among other compounds. In at least one example embodiment, ions of titanium (Ti) or carbon (C) may be injected into the second metal gate electrode 232 formed on the upper portion of the first fin active region 110 by performing an ion implantation process or a plasma-doping process or other process using the first photoresist pattern 241 as an ion implantation mask. When performing the ion implantation process, if the ion implantation angle is substantially equal to about 90-degrees, the ions of titanium or carbon may not be, or are rarely, injected into the second metal gate electrode 232 formed on the side portion of the first fin active region 110 Accordingly, it is possible to inject significantly more ions of titanium or carbon into the second metal gate electrode 232 formed on the upper portion of the first fin active region 110 as compared with the second metal gate electrode 232 formed on the side portion of the first fin active region 110 even when performing the plasma-doping process.

In at least one example embodiment, when an NMOS transistor is formed in the first region I, when the aluminum (Al) composition ratio of the second metal gate electrode 232 formed on the upper portion of the first fin active region 110 is reduced compared with the aluminum (Al) composition ratio of the second metal gate electrode 232 formed on the side portion of the first fin active region 110, the threshold voltage of the NMOS transistor at the upper surface of the first fin active region 110 may be greater than the threshold voltage of the NMOS transistor at the sidewall of the first fin active region 110, thereby the electric field concentration phenomenon would be reduced.

In at least one example embodiment, if a first portion is designated as a portion of the second metal gate electrode 232 formed on the upper portion of the first fin active region 110 and a second portion is designated as a portion of the second metal gate electrode 232 formed on the side portion of the first fin active region 110, the aluminum (Al) composition ratio at the first portion may be reduced about 3% to about 20% as compared with the aluminum (Al) composition ratio at the second portion by injecting ions of titanium (Ti) or carbon (C) into the first portion. For example, if the aluminum composition ratio of the first portion is about 25% to 27%, the aluminum composition ratio of the second portion may be about 5% to 24%.

Figure 10B:
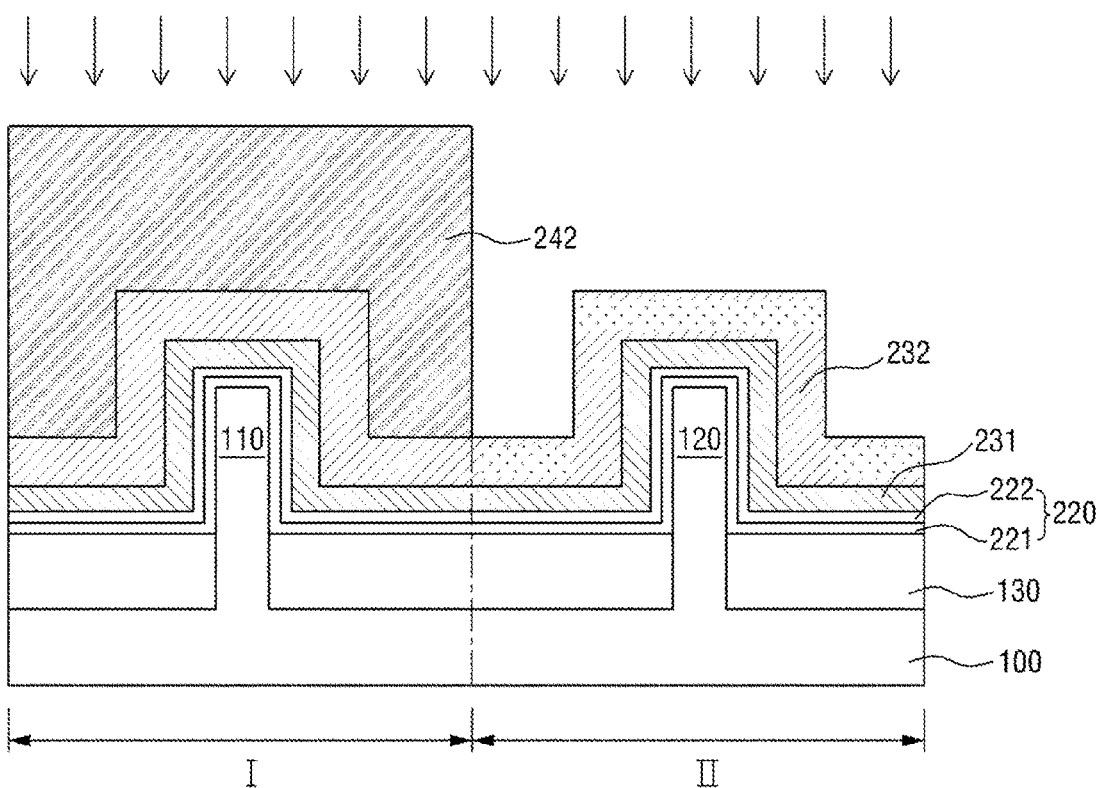

Referring to FIG. 10B, in at least one example embodiment, a second photoresist pattern 242 may be formed on the second metal gate electrode 232 formed in the first region I before forming the third metal gate electrode 233 shown in FIG. 9. The second metal gate electrode 232 may include aluminum (Al), e.g., titanium-aluminum-carbon compound (TiAlC) or titanium-aluminum-carbon-oxide compound (TiAlCO) or other compounds. Ions of aluminum (Al) may be injected into the second metal gate electrode 232 formed on the upper portion of the second fin active region 120 by performing an ion implantation process or a plasma-doping process or other process using the second photoresist pattern 242 as an ion implantation mask. When performing the ion implantation process, if the ion implantation angle is substantially equal to about 90-degrees, the ions of aluminum (Al) may not be, or are rarely, injected into the second metal gate electrode 232 formed on the side portion of the second fin active region 120. Accordingly, it is possible to inject significantly more ions of aluminum (Al) into the second metal gate electrode 232 formed on the upper portion of the second fin active region 120 as compared with the second metal gate electrode 232 formed on the side portion of the second fin active region 120 even when performing the plasma-doping process.

In at least one example embodiment, when a PMOS transistor is formed in the second region II, if the aluminum (Al) composition ratio of the second metal gate electrode 232 formed on the upper portion of the second fin active region 120 is increased as compared with the aluminum (Al) composition formed on the side portion of the second fin active region 120, the threshold voltage of the PMOS transistor at the upper surface of the second fin active region 120 may be greater than the threshold voltage of the PMOS transistor at the sidewall of the second fin active region 120, thereby the electric field concentration phenomenon would be reduced.

In at least one example embodiment, if a third portion is designated as a portion of the second metal gate electrode 232 formed on the upper portion of the second fin active region 120 and a fourth portion is designated as a portion of the second metal gate electrode 232 formed on the side portion of the second fin active region 120, the aluminum (Al) composition ratio at the third portion may be increased about 3% to about 13% as compared with the aluminum (Al) composition ratio at the fourth portion by injecting ions of aluminum (Al) into the third portion. For example, if the aluminum composition ratio of the fourth portion is about 25% to about 27%, that of the third portion may be about 28% to about 40%.

Figure 11A:
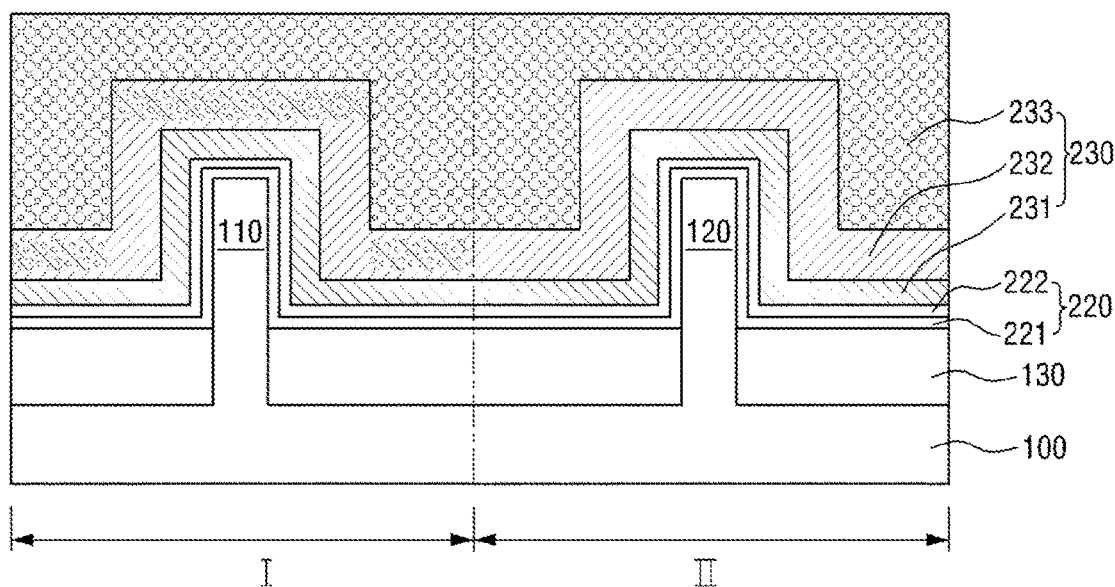

Referring to FIG. 11A, in at least one example embodiment, a third metal gate electrode 233 may be formed on the second metal gate electrode 232, after injecting titanium (Ti) or carbon (C) into the second metal gate electrode 232 formed the upper portion of the first fin active region 110 by performing an ion implantation process or a plasma-doping process or other process as discussed with respect to FIG. 10A. The first photoresist pattern 241 may be removed before forming the third metal gate electrode 233. The third metal gate electrode 233 may include tungsten (W) and may have a thickness of about 30 nm to about 200 nm.

Figure 11B:
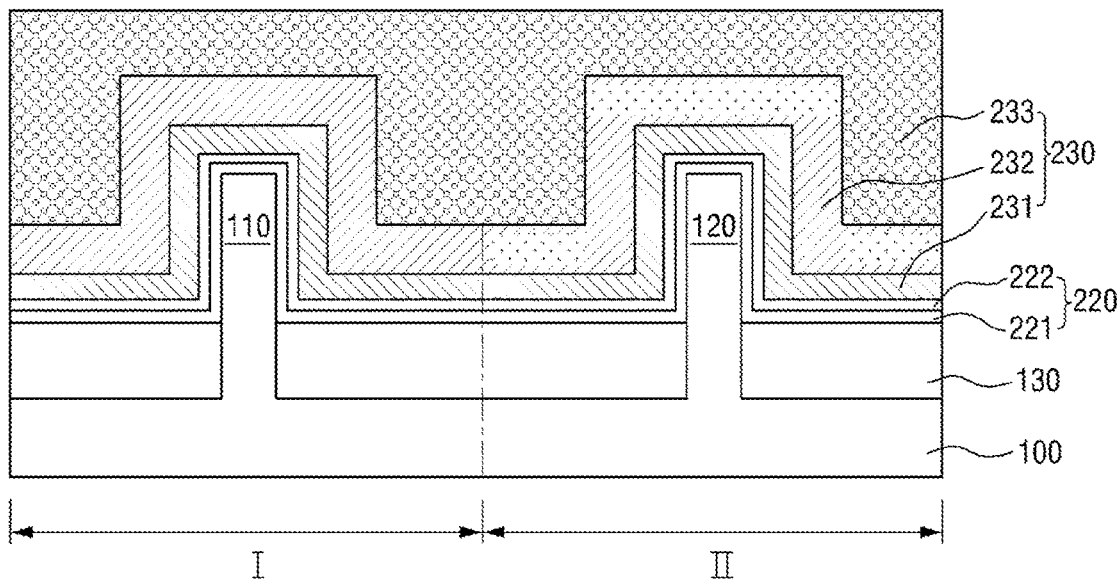

Referring to FIG. 11B, in at least one example embodiment, a third metal gate electrode 233 may be formed on the second metal gate electrode 232, after injecting aluminum (Al) into the second metal gate electrode 232 formed the upper portion of the second fin active region 120 by performing an ion implantation process or a plasma-doping process or other process as described with respect to FIG. 10B. The second photoresist pattern 242 may be removed before forming the third metal gate electrode 233. The third metal gate electrode 233 may include tungsten (W) and may have a thickness of about 30 nm to about 200 nm.

Figure 11C:
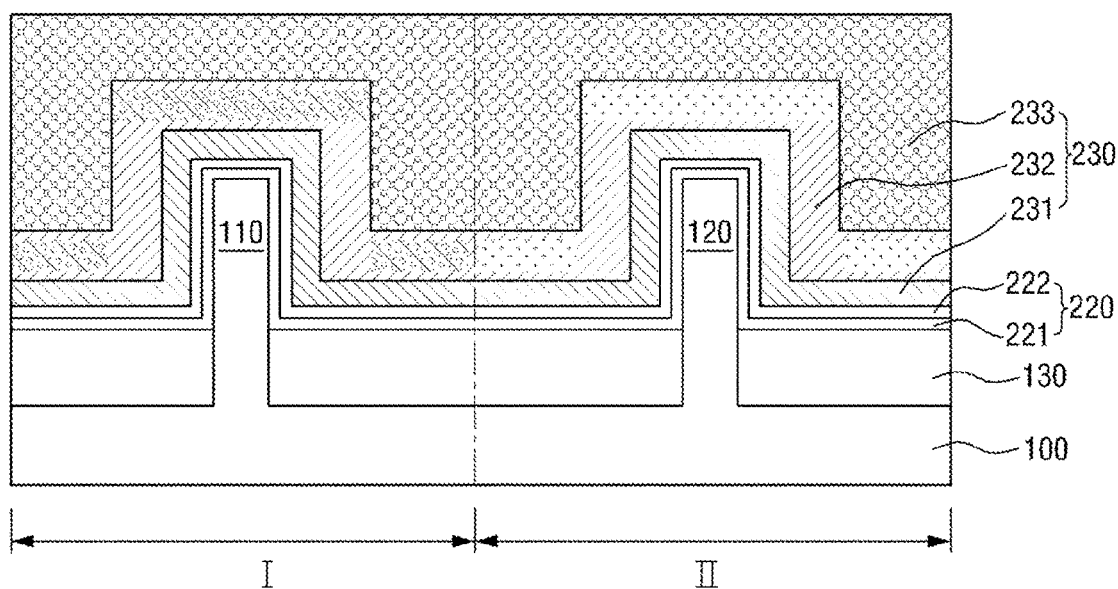

Referring to FIG. 11C, in at least one example embodiment, ions of titanium (Ti) or carbon (C) may be injected into the second metal gate electrode 232 formed on the upper portion of the first fin active region 110, as shown in FIG. 10A, and ions of aluminum (Al) may be injected into the second metal gate electrode 232 formed on the upper portion of the second fin active region 120, as shown in FIG. 10B. A third metal gate electrode 233 may be formed on the second metal gate electrode 232 in the first and second regions I and II. in at least one example embodiment, the first and second photoresist patterns 241 and 242 as shown in FIGS. 10A and 10B may be removed before forming the third metal gate electrode 233. The third metal gate electrode 233 may include tungsten (W) and may have a thickness of about 30 nm to about 200 nm. For example, the process described in FIG. 10B may be preceded by the process described in FIG. 10A.

in at least one example embodiment, after forming the third metal gate electrode 233, additional processes, e.g., a process for forming an interlayer dielectric layer and a process for forming an interconnection including contact plugs and bit lines, etc., may be performed to form a semiconductor device according to the example inventive concepts.

Figure 12:
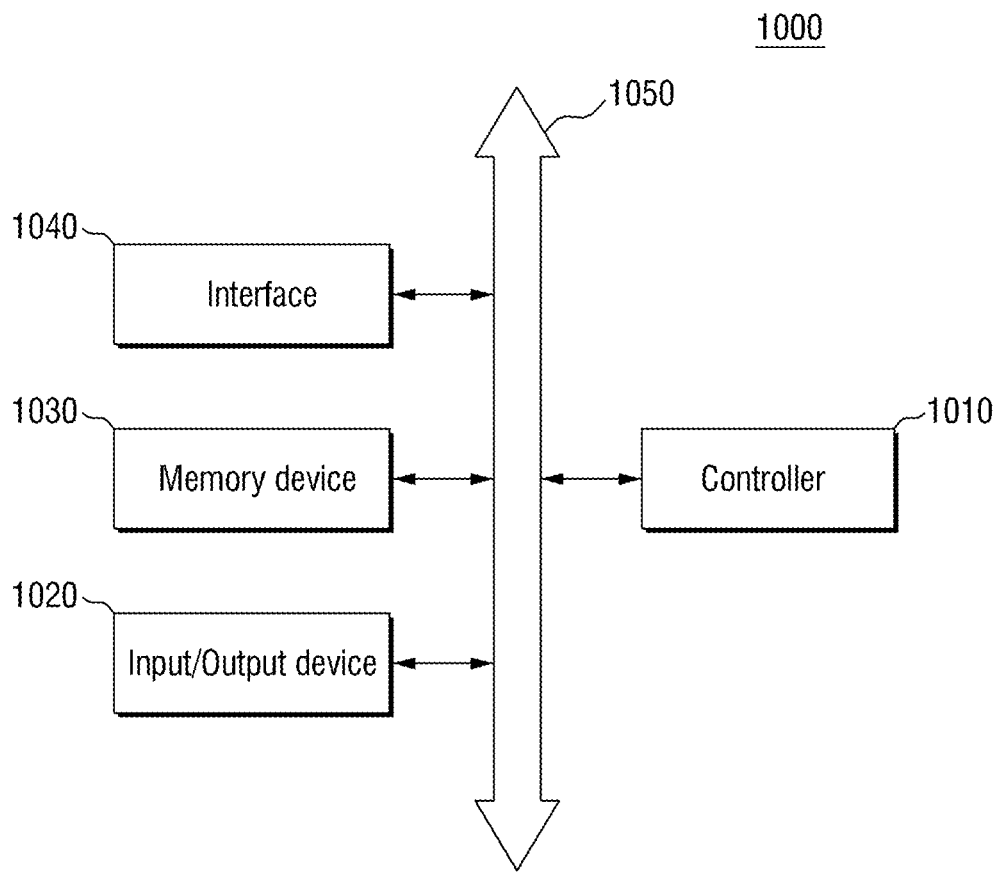
FIG. 12 is a schematic system including a semiconductor device manufactured according to an example embodiment of the inventive concepts.

FIG. 12 is a block diagram of a system 1000 including a semiconductor device manufactured according to an example embodiment of the inventive concepts. The system 1000 may comprise a controller 1010, an input/output device 1020, a memory device 1030, and an interface 1040. The system 1000 may be a portion of a mobile system or a product that can transport information, e.g., a navigation system, a solid state disk, or a household appliance. The mobile system may comprise a PDA, a portable computer, a web tablet, a wireless phone, a mobile phone, a digital music player, or a memory card. The controller 1010 may comprise a microprocessor, a digital signal processor, a microcontroller, or a similar device that can control an executive program. The input/output device 1020 may comprise a keypad, a keyboard, or a display.

In at least one example embodiment, the memory device 1030 may not only save codes or data for executing the controller 1010 but also save data executed by the controller 1010. The memory device 1030 may comprise a semiconductor device, which is having a NMOS or PMOS transistor, according to an example embodiment of the inventive concepts, e.g., the memory device 1030 may comprise at least one semiconductor device disclosed in FIGS. 1 through 11C.

In at least one example embodiment, the system 1000 may transport data to an external device through an interface 1040. The controller 1010, the input/output device 1020, the memory device 1030, and the interface 1040 may communicate with each other through a bus 1050.

Figure 13:
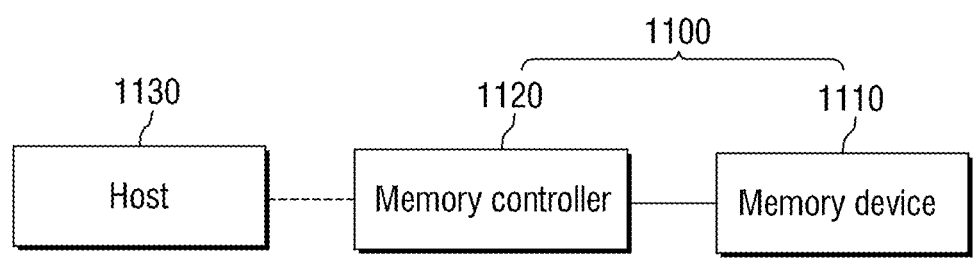
FIG. 13 is a memory card including a semiconductor device manufactured according to an example embodiment of the inventive concepts.

FIG. 13 is another block diagram illustrating a memory card 1100 including a semiconductor device manufactured according to an example embodiment of the inventive concepts. The memory card 1100 may comprise a memory device 1110 and a memory controller 1120. The memory device 1110 may include a DRAM, a FLASH, or a logic device which is manufactured according to an example embodiment of the inventive concepts. The memory controller 1120 may read/save data from/to the memory device 1110 by requesting from a host 1130. The memory controller 1120 may include at least one semiconductor device manufactured as illustrated in FIGS. 1 through 11C.

The above-disclosed subject matter is to be considered illustrative and not restrictive, and the appended claims are intended to cover all such modifications, enhancements, and other embodiments, which fall within the true spirit and scope of the inventive concepts. Thus, to the maximum extent allowed by law, the scope of the inventive concepts is to be determined by the broadest permissible interpretation of the following claims and their equivalents, and shall not be restricted or limited by the foregoing detailed description.

What is claimed is:

1. A semiconductor device, comprising:
a substrate including an NMOS region and a PMOS region;
a first fin active region protruding from the substrate in the NMOS region, the first fin active region including an upper surface and a sidewall;
a second fin active region protruding from the substrate in the PMOS region, the second fin active region including an upper surface and a sidewall;
a gate dielectric layer on the upper surfaces and the sidewalls of the first and second fin active regions;
a first metal gate electrode on the gate dielectric layer, the first metal gate electrode having a first thickness at the upper surface of the first fin active region, a second thickness at the sidewall of the first fin active region, a third thickness at the upper surface of the second fin active region, and a fourth thickness at the sidewall of the second fin active region; and
a second metal gate electrode on the first metal gate electrode, the second metal gate electrode having a fifth thickness at the upper surface of the first fin active region, a sixth thickness at the sidewall of the first fin active region, a seventh thickness at the upper surface of the second fin active region, and an eighth thickness at the sidewall of the second fin active region,
wherein the third thickness is less than the fourth thickness, and/or wherein the fifth thickness is less than the sixth thickness.

2. The semiconductor device as claimed in claim 1, wherein at least one of the first thickness is greater than the second thickness, and the seventh thickness is greater than the eighth thickness.

3. The semiconductor device as claimed in claim 1, wherein the first metal gate electrode comprises a first material having a first work function; and
wherein the second metal gate electrode comprises a second material having a second work function, the second work function being less than the first work function.

4. The semiconductor device as claimed in claim 1, wherein the first metal gate electrode comprises titanium nitride (TiN); and
wherein the second metal gate electrode comprises at least one of titanium aluminum carbon compound (TiAlC) and titanium aluminum carbon oxide compound (TiAlCO).

5. The semiconductor device as claimed in claim 1, wherein the gate dielectric layer comprises a high-k dielectric layer.

6. The semiconductor device as claimed in claim 1, further comprising a third metal gate electrode on the second metal gate electrode.

7. The semiconductor device of claim 1, wherein the upper surface of the fin active region is at a portion of the fin active region having a greatest height with respect to a surface of the substrate.

8. A semiconductor device, comprising:
a substrate including an NMOS region;
a fin active region protruding from the substrate in the NMOS region, the fin active region including an upper surface and a sidewall;
a gate dielectric layer on the upper surface and the sidewall of the fin active region;
a first metal gate electrode on the gate dielectric layer, the first metal gate electrode having a first thickness at the upper surface of the fin active region and a second thickness at the sidewall of the fin active region;
a second metal gate electrode on the first metal gate electrode, the second metal gate electrode having a third thickness at the upper surface of the fin active region and a fourth thickness at the sidewall of the fin active region, wherein the third thickness is less than the fourth thickness;
an interlayer dielectric layer having a trench on the fin active region, the first and second metal gate electrodes being formed in the trench; and
a third metal gate electrode directly on the second metal gate electrode, the third metal gate electrode filling the trench and including a planarized upper surface.

9. The semiconductor device as claimed in claim 8, wherein the first thickness is greater than the second thickness.

10. The semiconductor device of claim 8, wherein the upper surface of the fin active region is at a portion of the fin active region having a greatest height with respect to a surface of the substrate.

11. A semiconductor device, comprising:
a substrate including a PMOS region;
a fin active region protruding from the substrate in the PMOS region, the fin active region including an upper surface and a sidewall;
a gate dielectric layer on the upper surface and the sidewall of the fin active region;
a first metal gate electrode directly on the gate dielectric layer, the first metal gate electrode having a first thickness at the upper surface of the fin active region and a second thickness at the sidewall of the fin active region;
a second metal gate electrode on the first metal gate electrode, the second metal gate electrode having a third thickness at the upper surface of the fin active region and a fourth thickness at the sidewall of the fin active region, wherein the first thickness is less than the second thickness;
an interlayer dielectric layer having a trench on the fin active region, the first and second metal gate electrodes being formed in the trench; and
a third metal gate electrode directly on the second metal gate electrode, the third metal gate electrode filling the trench and including a planarized upper surface.

12. The semiconductor device as claimed in claim 1, wherein the third thickness is greater than the fourth thickness.

13. The semiconductor device of claim 11, wherein the upper surface of the fin active region is at a portion of the fin active region having a greatest height with respect to a surface of the substrate.

* * * * *